United States Patent
Fang et al.

(10) Patent No.: US 9,590,177 B2
(45) Date of Patent: Mar. 7, 2017

(54) ORGANIC LIGHT-EMITTING DISPLAY PANEL AND FABRICATION METHOD THEREOF

(71) Applicant: AU Optronics Corp., Hsin-Chu (TW)

(72) Inventors: Shou-Wei Fang, Hsin-Chu (TW); Wei-Hao Tseng, Hsin-Chu (TW); Chia-Yang Lu, Hsin-Chu (TW); Chien-Tao Chen, Hsin-Chu (TW); Tsung-Hsiang Shih, Hsin-Chu (TW); Hung-Che Ting, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/615,408

(22) Filed: Feb. 5, 2015

(65) Prior Publication Data
US 2015/0243890 A1 Aug. 27, 2015

(30) Foreign Application Priority Data
Feb. 26, 2014 (TW) .............................. 103106599 A

(51) Int. Cl.
*H01L 51/00* (2006.01)
*H01L 27/32* (2006.01)

(52) U.S. Cl.
CPC ...... *H01L 51/0005* (2013.01); *H01L 27/3246* (2013.01); *H01L 27/3258* (2013.01)

(58) Field of Classification Search
CPC ............. H01L 51/0005; H01L 27/3246; H01L 27/3258
See application file for complete search history.

(56) References Cited

U.S. PATENT DOCUMENTS

| | | | |
|---|---|---|---|
| 8,212,267 B2 | 7/2012 | Oosako | |
| 8,541,779 B1 | 9/2013 | Chen | |
| 2012/0049178 A1 | 3/2012 | Sugimoto | |
| 2014/0147950 A1* | 5/2014 | Choi | H01L 51/0005 438/46 |
| 2014/0361253 A1* | 12/2014 | Choi | H01L 27/32 257/40 |
| 2015/0102292 A1* | 4/2015 | Kim | H01L 27/3246 257/40 |

FOREIGN PATENT DOCUMENTS

| | | |
|---|---|---|
| CN | 102450102 A | 5/2012 |
| CN | 103035846 A | 4/2013 |
| TW | 201349299 A | 12/2013 |

\* cited by examiner

*Primary Examiner* — John P Dulka
*Assistant Examiner* — Charles R Peters
(74) *Attorney, Agent, or Firm* — McClure, Qualey & Rodack, LLP

(57) ABSTRACT

An organic light-emitting display panel and a fabrication method thereof include using an inkjet printing process to form the organic emission material of the display panel and providing a specific design of the relative position of the spacer and the planarization layer with ink-repellent material such that the spacer can be effectively fixed on the array substrate without falling from the planarization layer.

21 Claims, 8 Drawing Sheets

ORGANIC LIGHT-EMITTING DISPLAY PANEL AND FABRICATION METHOD THEREOF

BACKGROUND OF THE INVENTION

1. Field of the Invention

The present invention relates to an organic light-emitting display (OLED) panel and a fabrication method thereof, and more particularly, to an organic light-emitting display panel and related fabrication method by using inkjet printing process to form the organic light-emitting display panel.

2. Description of the Prior Art

Since the organic light-emitting display panel has advantages of self-luminous, high contrast ratio, compact size, and wide viewing angles, it is expected to be the mainstream product of the flat display panel in the new generation. In the fabrication process of organic light-emitting display panels, evaporation process or inkjet printing (IJP) process may be used to form the materials of the organic light-emitting devices on the array substrate. In the IJP process, a specific insulating material is required to be used for defining the emission region in order to ensure the formed organic material having a good profile, which is different the insulating material used in the evaporation process. However, the insulating material used in the IJP processes will cause poor adhesion or ineffectively fixation in the subsequent production of the spacers disposed thereon. In the prior art, it is chosen to form the spacer on the surface of the upper cover plate to improve the problem of the poor bonding of the spacers, but this process requires to additionally form alignment marks on the surfaces of the substrates for the substrate assembly process, which increases the process cost. Therefore, it is still an important issue for the manufacturer to continuously research on how to fabricate organic light-emitting display panels with a cost-effective method.

SUMMARY OF THE INVENTION

One of the objectives of the present invention is to provide an organic light-emitting display panel and a fabrication method thereof including using a specific design of the relative position of the spacer and the planarization layer with ink-repellent material such that the spacer can be effectively fixed on the array substrate to improve the yield.

To achieve the above objective, one of the embodiments of the present invention provides an organic light-emitting display panel that includes a substrate, a planarization layer, a patterned first conductive layer, at least one spacer, and an organic light-emitting material layer. The substrate has at least one spacer region and at least one emission region. The planarization layer covers the spacer region but at least exposes the emission region, and the planarization layer includes ink-repellent material. The patterned first conductive layer is disposed on the surface of the substrate. The patterned first conductive layer includes a bottom electrode at least disposed in the emission region and a position-retention element disposed on the surface of the planarization layer in the spacer region, wherein the position-retention element is electrically insulated from the bottom electrode. In addition, the spacer is disposed on the surface of the position-retention element, and the organic light-emitting material layer is disposed on the surface of the bottom electrode in the emission region.

To achieve the above objective, one of the embodiments of the present invention provides a fabrication meted of an organic light-emitting display panel. The fabrication method includes first providing a substrate that has at least one spacer region, at least one switch element region and at least one emission region, forming a switch element in the switch element region, forming a planarization layer on the substrate, wherein the planarization layer covers the spacer region and the switch element but at least exposes the emission region, and the planarization layer exposes a portion of the switch element and includes ink-repellent materials. The fabrication meted further includes forming a patterned first conductive layer on the substrate, wherein the patterned first conductive layer comprises a bottom electrode at least disposed in the emission region and electrically connected to the switch element and a position-retention element disposed on the surface of the planarization layer in the spacer region. The position-retention element is electrically insulated from the bottom electrode. Next, at least one spacer is formed on the surface of the position-retention element, and an organic light-emitting material layer is formed by performing an IJP process, wherein the organic light-emitting material layer is disposed in the emission region and on the surface of the bottom electrode.

To achieve the above objective, an embodiment of the present invention further provides an organic light-emitting display panel including a substrate, a bottom electrode, at least one spacer, a planarization layer, and an organic emitting material. The substrate has at least one spacer region and at least one emission region. The bottom electrode is disposed on the surface of the substrate and at least in the emission region. The spacer is disposed in the spacer region. The planarization layer is disposed on the surface of the substrate and covers the spacer, and the planarization at least exposes the emission region. The organic light-emitting material layer is disposed at least on the surface of the bottom electrode in the emission region and covers a portion of the planarization layer.

From the above, according to the present invention, the patterned first conductive layer is first formed on top of the planarization layer with ink-repellent material, and then the spacer is formed on the patterned first conductive layer. Alternatively, the spacer is first formed and then the planarization layer with ink-repellent material is formed on the spacer. The present invention could effectively prevent the spacer from ineffectively fixing and easily detaching from the substrate in the prior art caused by fabricating the spacer on the planarization layer. As a result, the product yield can be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 shows a partial cross-section view of an organic light-emitting display panel according to the second embodiment of the present invention.

DETAILED DESCRIPTION

Figure 1:
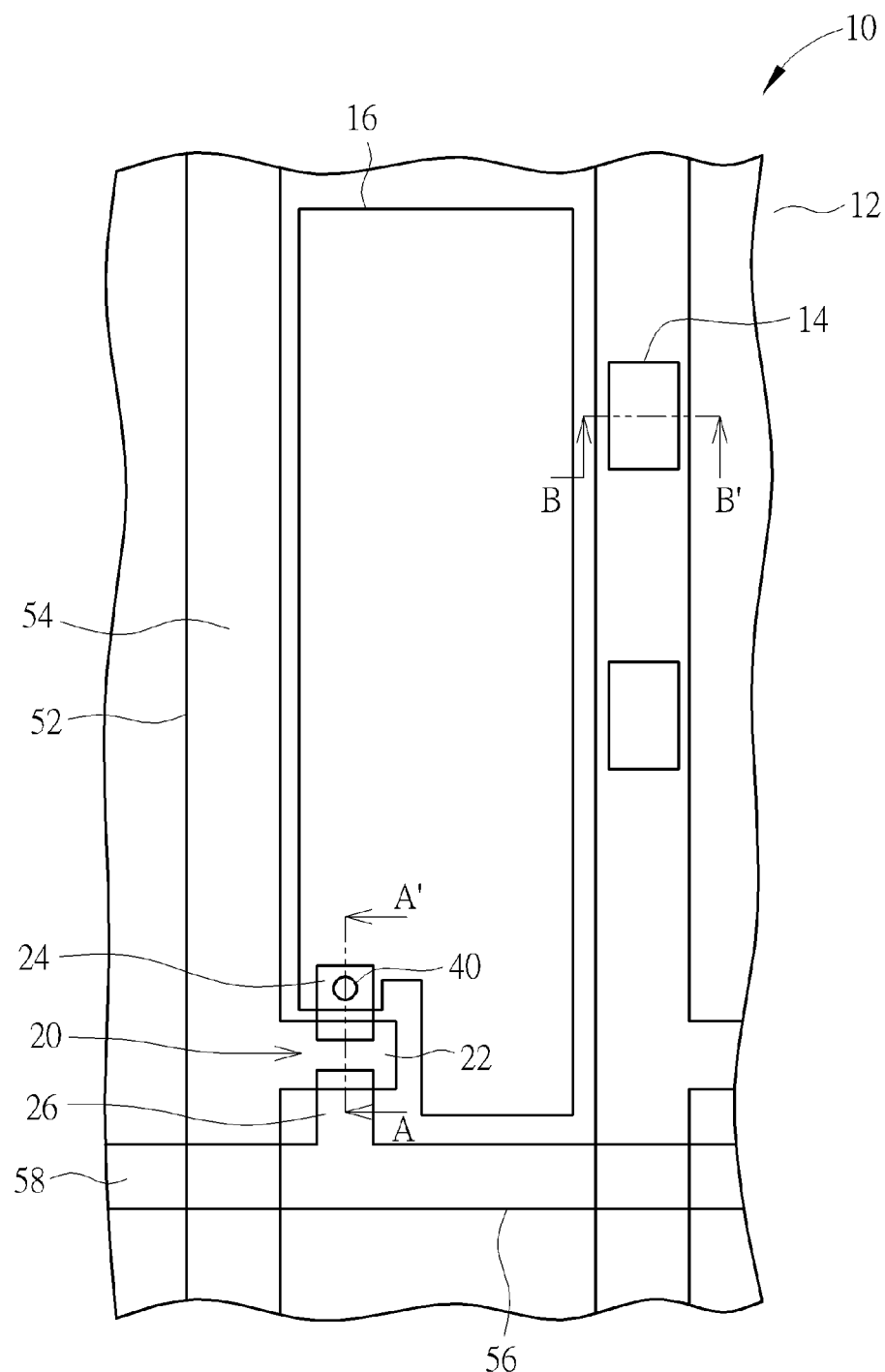
FIG. 1 is a schematic diagram of the top view of an organic light-emitting display panel according to the first embodiment of the present invention.
Figure 2:
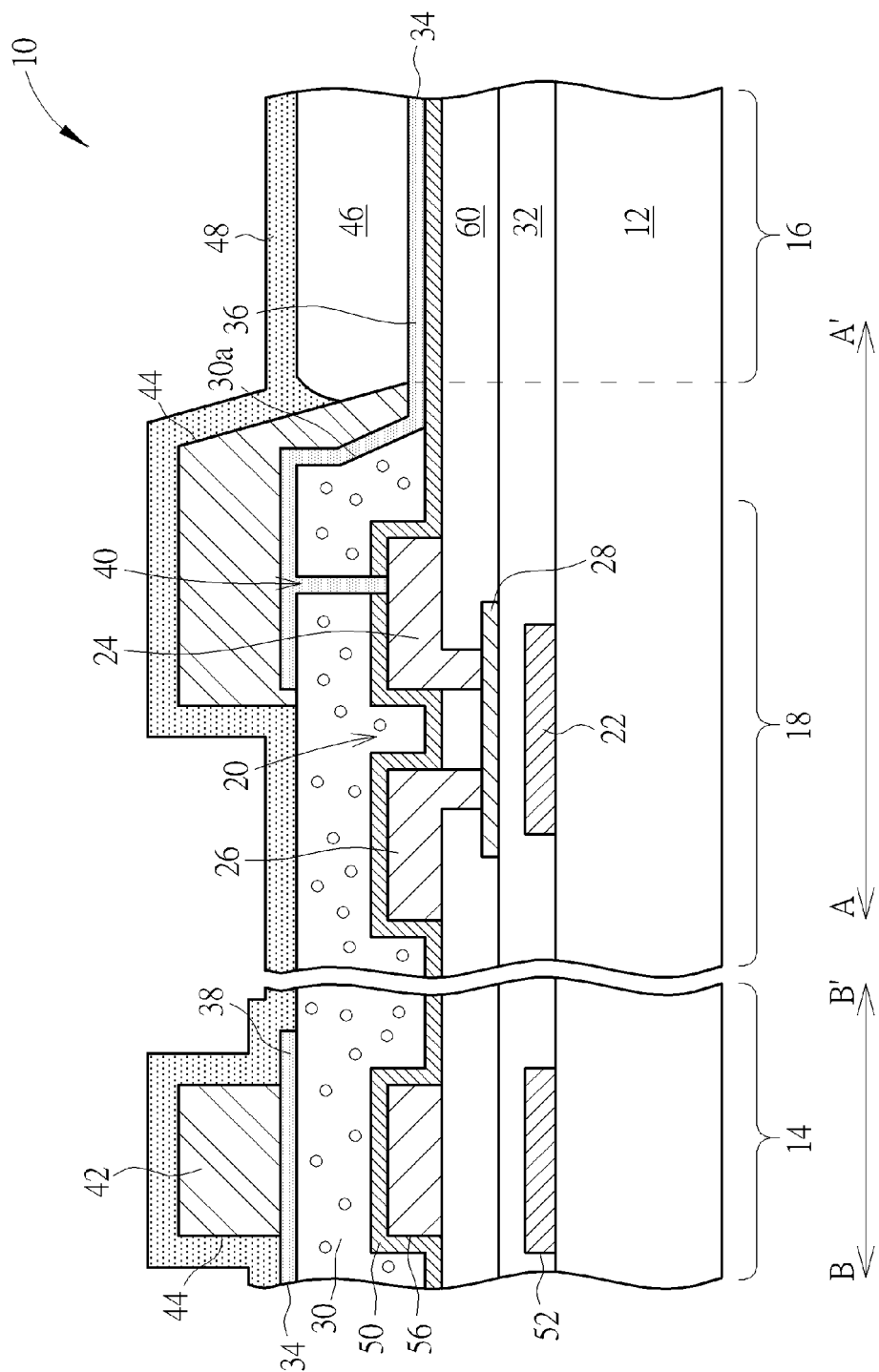
FIG. 2 is a schematic diagram of the partial cross-sectional view along the cross lines A-A' and B-B' of the organic light-emitting display panel shown in FIG. 1.

Refer to FIG. 1 and FIG. 2, FIG. 1 is a schematic diagram of the top view of an organic light-emitting display panel according to the first embodiment of the present invention, and FIG. 2 is a schematic diagram of the partial cross-sectional view along the cross lines A-A' and B-B' of the organic light-emitting display panel shown in FIG. 1. The organic light-emitting display panel of the present invention is particularly suitable for the application of using the IJP process to fabricate the organic light-emitting element materials. In the first embodiment, the organic light-emitting display panel 10 of the present invention includes a substrate 12, wherein the surface of the substrate 12 has at least one spacer region 14 and at least one emission region 16. Generally the organic light-emitting display panel 10 is made of a plurality of pixels arranged in an array and each pixel includes at least one switch element and an organic light-emitting element disposed on the substrate 12, and therefore the substrate 12 can be called as an array substrate. The substrate 12 also has at least one switch element region 18 disposed at one side of the emission region 16. In this embodiment, the switch element for example is a thin film transistor (TFT) 20. It includes a gate 22, a drain 24, a source 26, and a semiconductor channel layer 28. Wherein, the drain 24 and the source 26 respectively contact with the semiconductor channel layer 28, and a gate insulating layer 32 is disposed between the semiconductor channel layer 28 and the gate 22. The semiconductor channel layer 28 may be composed of amorphous silicon material, polysilicon material, or metal oxide semiconductor material, but not limited thereto. In this embodiment, an oxide thin film transistor is adopted as the thin film transistor 20 for example, thus the material of the semiconductor channel layer 28 for example includes indium gallium zinc oxide (called as InGaZnO or IGZO).

In addition, the organic light-emitting display panel 10 further includes a planarization layer 30, a patterned first conductive layer 34, at least one spacer 42, and at least one organic light-emitting material layer 46. The planarization layer 30 covers the spacer region 14 and has at least one opening 30a. The opening 30a of the planarization layer 30 at least exposes the emission region 16. According to the organic light-emitting display panel 10 of this embodiment, the planarization layer 30 may be used for defining the position of the emission region 16, the position of the organic material or light-emitting element fabricated in the subsequent processes. Since the IJP process is adopted to form at least one organic material in the emission region 16 in the organic light-emitting display panel 10 of this embodiment, the planarization layer 30 preferably includes ink-repellent material to make the organic material formed subsequently in the emission region 16 have an arc surface resulted from the ink repellent of the planarization layer 30. Wherein, the material of the planarization layer 30 for example may include fluorine-containing photoresist material or other ink-repellent material. Moreover, the patterned first conductive layer 34 disposed on the surface of the substrate 12 includes at least one bottom electrode 36 and at least one position-retention element 38. The bottom electrode 36 is at least disposed in the emission region 16, and a portion of the bottom electrode 36 may extend to the switch element region 18 and is electrically connected to the drain 24. On the other hand, the position-retention element 38 is disposed on the planarization layer 30 in the spacer region 14, covering a portion of the planarization layer 30. The position-retention element 38 does not connect to the bottom electrode 36 and is electrically insulated from the bottom electrode 36. The spacer 42 is disposed in the spacer region 14 and on the surface of the position-retention element 38. The spacer 42 is composed of a spacer material layer 44 that may include photoresist spacer material for example. The organic light-emitting material layer 46 is disposed in the emission region 16 and on the surface of the bottom electrode 36. Furthermore, the organic light-emitting material layer 46 may include not only one organic material layer and may include several organic layers, such as including a hole injection layer (HIL), a hole transport layer (HTL), an emissive layer (EML), an electron transport layer (ETL), and an electron injection layer (EIL). According to this embodiment, at least one of the above organic material layers is fabricated by the IJP process, such as the HIL layer, the HTL layer, and the EML layer, but not limited thereto. It should be noted that the spacer material layer 44 may be optionally formed in the partial surrounding area or the entire surrounding area of the emission region 16 to cover a portion of the bottom electrode 36. In this case, the organic light-emitting material layer 46 formed subsequently will directly contact the spacer material layer 44. Therefore, the spacer material layer 44 preferably includes, but not limited to, fluorine-containing photoresist material or other ink-repellent material to make some or all of layers of the organic light-emitting material layer 46 fabricated by the IJP process have better profile. It is noted that the bottom electrode 36 does not completely surround the emission region 16, thus the space material layer 44 only has to be disposed in the portion of the surrounding area where the bottom electrode 36 positioned to make the organic light-emitting material layer 46 has a better profile. As a result, in the surrounding area of the emission region 16 without the bottom electrode 36, the organic light-emitting material layer 46 is in direct contact with the planarization layer 30 that includes the ink-repellent quality, but not limited to. However, in a different embodiment, the spacer material layer 44 may not be disposed in the surrounding area of the emission region 16. Therefore, the organic light-emitting material layer 46 is directly in contact with a portion of the bottom electrode 36 and the planarization layer 30 in the surrounding area of the emission region 16. Moreover, the organic light-emitting display panel 10 may further include an upper electrode 48 disposed on the organic light-emitting material layer 46. In this embodiment, the upper electrode 48, the organic light-emitting material layer 46, and the bottom electrode 36 may be regarded as an organic light-emitting element. The bottom electrode 36 may serve as the anode of the organic light-emitting emit while the upper electrode 48 may serve as the cathode; or the bottom electrode 36 may serve as the cathode of the organic light emission element and the upper electrode 48 may serve as the anode. In addition, when the organic light-emitting display panel 10 is a top emission display panel, the bottom electrode 36 or the patterned first conductive layer 34 may include conductive materials with lower transparency, such as aluminum neodymium (AlNd) material, and the upper electrode 48 includes the material with better transparence, such as indium tin oxide (ITO), but not limited thereto. On the other hand, if the organic light-emitting display panel 10 is a bottom emission display panel, the bottom electrode 36 may include transparent conductive material such as ITO, and the upper electrode 48 may include conductive material with low transparency, but not limited thereto.

The organic light-emitting display panel 10 of the present invention may further include a protection layer 50 disposed on the substrate 12. The protection layer 50 is disposed at the lower side of the planarization layer 30 and covers the emission region 16, the spacer region 14, and a portion of the thin film transistor 20. The protection layer 50 and the planarization layer 30 have a contact hole 40 exposing a portion of the drain 24 so that the bottom electrode 36 can be electrically connected to the drain 24 through the contact hole 40. The material of the protection layer 50 for example may be silicon oxide (SiOx), silicon nitride (SiNx), or aluminum oxide (AlOx), but not limited thereto. Since the thin film transistor 20 in this embodiment is an oxide thin film transistor, the protection layer 50 is AlOx for example. Furthermore, the gate 22 in this embodiment may be formed by a second conductive layer 52, and the second conductive layer 52 may further include at least one gate line 54. For instance, the gate line 54 may partially overlap with the spacer 42, but not limited thereto. In addition, the drain 24 and the source 26 are composed of the same third conductive layer 56. The third conductive layer 56 may further include at least one source line 58 that intersects with, but being electrically insulated from, the gate line 54. The second conductive layer 52 and the third conductive layer 56 may further include at least one portion disposed in the spacer region 14 respectively, between the spacer 42 and the substrate 12 and covered by the protection layer 50, as marked in FIG. 2 with the symbols 52 and 56. It should be noted that one or more of the gate line, the source line, and the dummy metal layer may be disposed under the spacer 42 in the spacer region 14 in the variation embodiments of the present invention, wherein the disposition of the above-mentioned elements helps the planarization of the film layers disposed on the surface of the substrate 12. However, in different embodiments, it is possible that no conductive material layer is disposed under the spacer 42.

Figure 3:
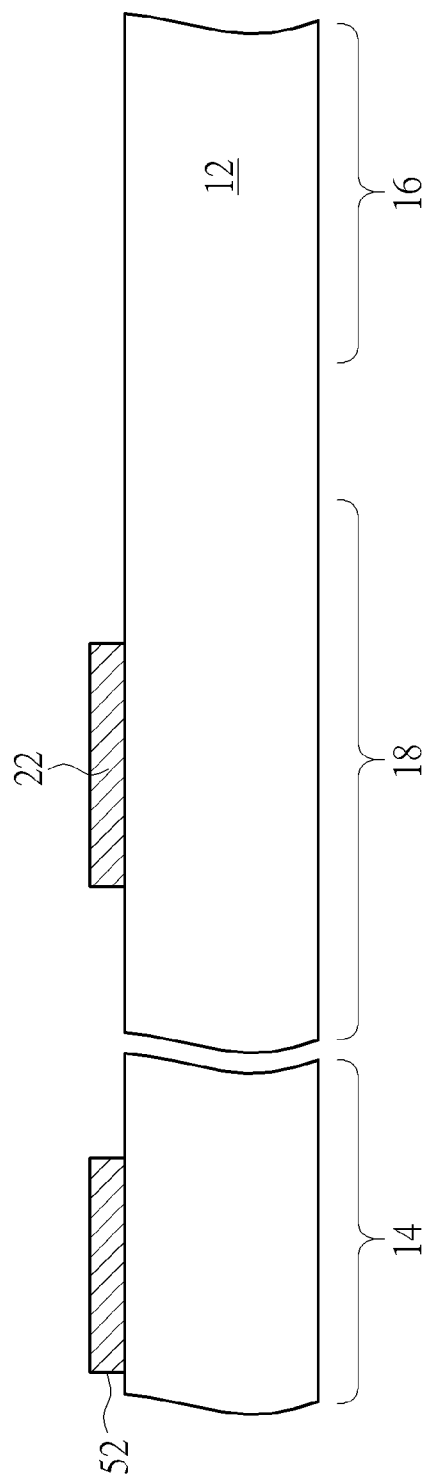
FIG. 3 to FIG. 6 are schematic diagrams illustrating the processes of the fabrication method of the organic light-emitting display panel according to the first embodiment of the present invention.
Figure 4:
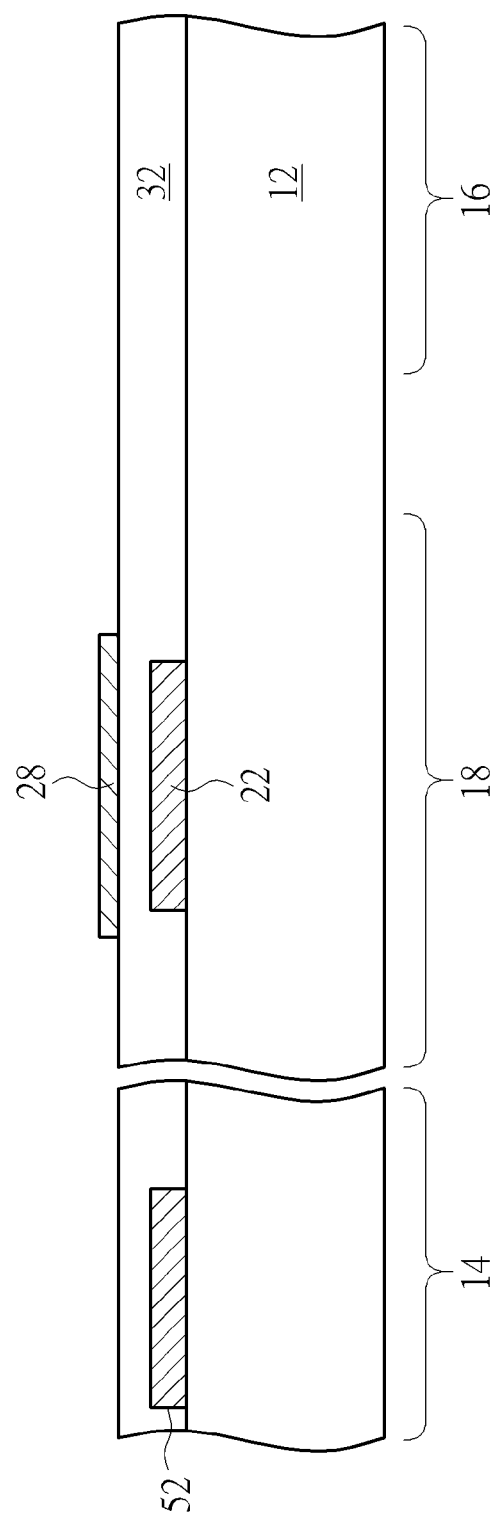

Referring to FIG. 3 to FIG. 6, FIG. 3 to FIG. 6 are schematic diagrams illustrating the processes of the fabrication method of the organic light-emitting display panel according to the first embodiment of the present invention. As shown in FIG. 3, according to the first embodiment of the present invention, a substrate 12 is first provided, and the substrate 12 has at least one spacer region 14, at least one switch element region 18 and at least one emission region 16. Next a patterned second conductive layer 52 is formed on the surface of the substrate 12, wherein the second conductive layer 52 includes a gate 22 disposed in the switch element region 18. Moreover, according to the first embodiment, the second conductive layer 52 further includes a portion disposed in the spacer region 14. The material of the second conductive layer 52 for example can be aluminum, copper, molybdenum, molybdenum nitride, titanium, or ITO, but not limited thereto. Referring to FIG. 4, a gate insulating layer 32 is then formed on the surface of the substrate 12, covering the second conductive layer 52. After that, a semiconductor material layer is formed above the gate insulating layer 32. After patterning the semiconductor material layer, the semiconductor channel layer 28 is formed in the switch element region 18. The material of the gate insulating layer 32 for example is SiOx, SiNx, or AlOx, but not limited thereto. The material of the semiconductor channel layer 28 can be any known semiconductor material. As mentioned in above, the material of the semiconductor channel layer 28 in this embodiment is metal oxide as an example, such as IGZO, but not limited thereto.

Figure 5:
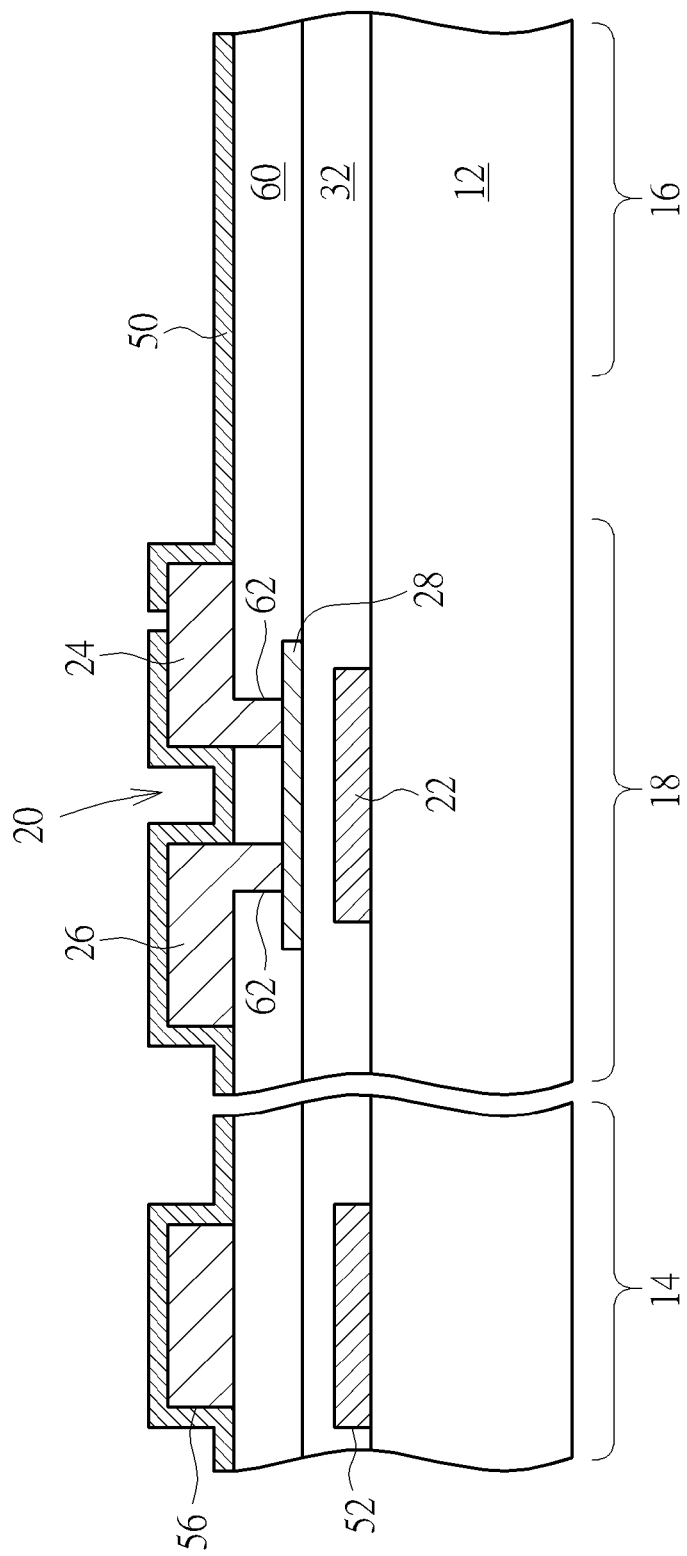

Next, refer to FIG. 5. An insulating layer 60 is formed on the surface of the substrate 12. After a patterning process, two contact holes 62 are formed in the insulating layer 60. Then, a patterned third conductive layer 56 is formed on the surface of the substrate 12. The material of the third conductive layer 56 may include metal material, but not limited thereto. The patterned third conductive layer 56 includes a source 26 and a drain 24 disposed in the switch element region 18, which are electrically connected to the semiconductor channel layer 28 through one contact hole 62 respectively. In addition, according to this embodiment, the patterned third conductive layer 56 may optionally further include a portion disposed in the spacer region 14. After forming the source 26 and the drain 24, the fabrication of the switch element (the thin film transistor 20) according to the method of the present invention is substantially complete. The fabrication method of the patterned third conductive layer 56 may optionally include forming an entire conductive layer on the insulating layer 60 blanketly, and then performing a photolithography and etching process to pattern the conductive layer to form the source 26 and the drain 24, wherein the insulating layer 60 can be used as an etching stop layer in the etching process. In addition, the material of the insulating layer 60 for example is SiOx, SiNx, or AlOx. The material of the third conductive layer 56 for example may be aluminum, copper, molybdenum, molybdenum nitride, titanium, or ITO, but not limited thereto. Next, a protection layer 50 is optionally formed on the surface of the substrate 12, which covers the emission region 16, the spacer region 14, and a portion of the thin film transistor 20. Wherein, the material of the protection layer 50 may be as mentioned above, such as SiOx, SiNx, and AlOx, but not limited thereto.

Figure 6:
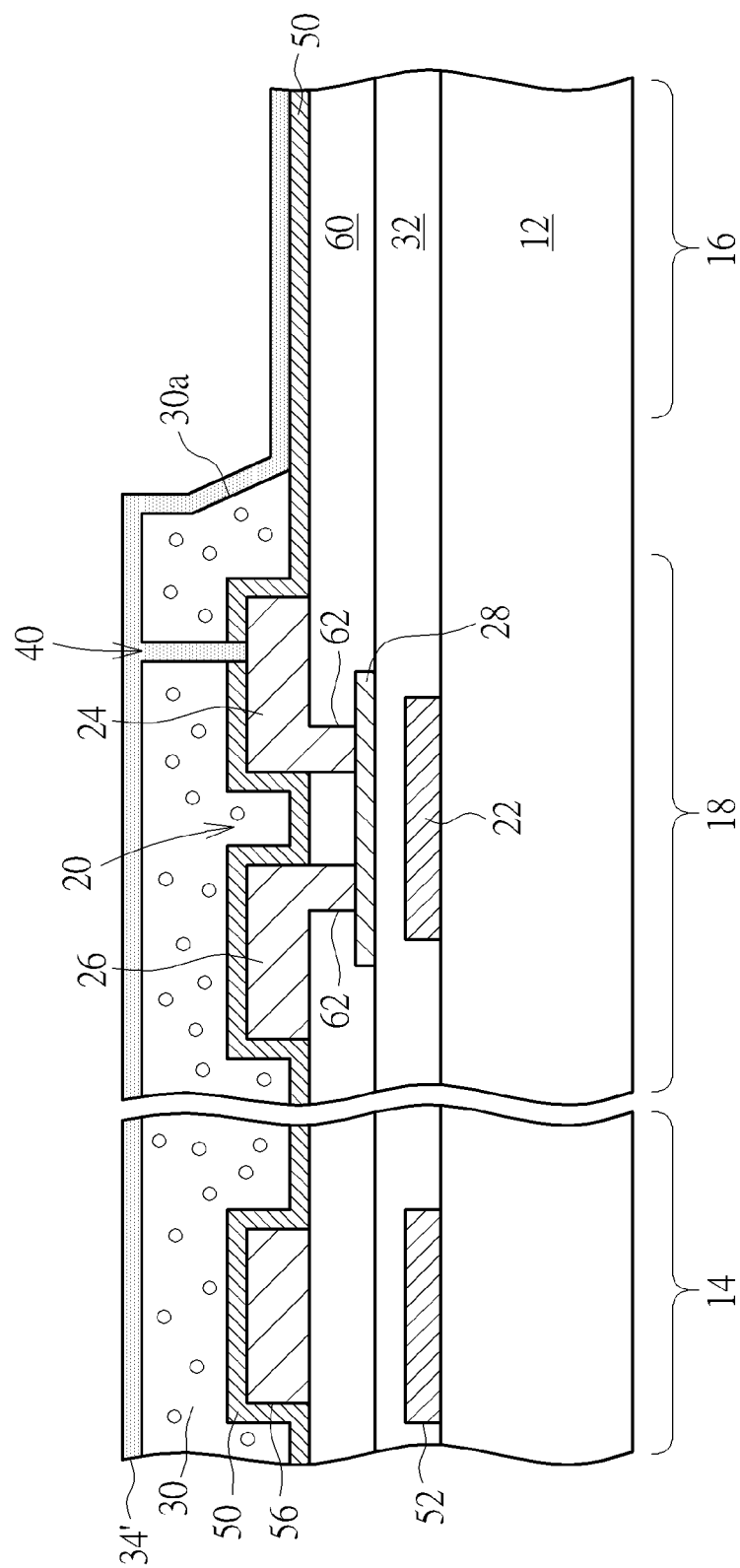

Referring to FIG. 6, a planarization layer 30 is then formed on the substrate 12. The planarization layer 30 covers the protection layer 50. After the planarization layer 30 is patterned, it covers the spacer region 14 and the switch element region 18, but at least exposes the emission region 16. In addition, the planarization layer 30 and the protection layer 50 have the contact hole 40 that exposes a portion of the drain 24 of the thin film transistor 20. The planarization layer 30 includes ink-repellent material such as fluoride photoresist or other ink-repellent material. Afterwards, the first conductive layer 34' is formed on the surface of the substrate 12, wherein a portion of the first conductive layer 34' fills in the contact hole 40 and contacts the drain 24.

Next, referring back to FIG. 2, a patterning process is performed to the first conductive layer 34' to form the patterned first conductive layer 34, which includes a bottom electrode 36 and a position-retention element 38 insulated from each other. Then, a patterned spacer material layer 44 is formed on the surface of the substrate 12, which includes at least one spacer 42 disposed on the surface of the position-retention element 38, and the spacer material layer 44 may further include a portion disposed in a portion of the surrounding area of the emission region 16 covering a portion of the surface of the bottom electrode 36. The spacer material layer 44 preferably includes fluorine-containing photoresist material or other ink-repellent material. At last, an IJP process is performed to form at least one organic material layer on the surface of the bottom electrode 36 in the emission region 16, such as forming the organic light-emitting material layer 46 or forming at least one portion of the organic light-emitting material layer 46. Then, an upper electrode 48 is optionally formed on the organic light-emitting material layer 46 to finish the fabrication of the organic light-emitting element. Afterwards, a cover plate (not shown in the figure) may be optionally disposed on the surface of the substrate 12 to complete the organic light-emitting display panel 10 of the present invention.

According to this embodiment, since the position-retention element 38 is formed in the spacer region 14 before forming the spacer 42, the following formed spacer 42 is disposed on the surface of the position-retention element 38 instead of being directly formed on the surface of the planarization layer 30. In other words, the position-retention element 38 is disposed between the planarization layer 30 with ink-repellent property and the spacer 42. This design makes the spacer 42 stably fixed and attached on the surface of the position-retention element 38 and can effectively prevent the spacer from easily falling down when it is formed directly on the planarization layer 30 in the prior art. Also, there is no need to change the fabrication process of the spacer 42 to additionally fabricate it on the surface of the cover plate. As a result, the production cost can be effectively reduced according to the present invention.

The organic light-emitting display panel of the present invention and the fabrication method thereof are not limited to the above embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 7:
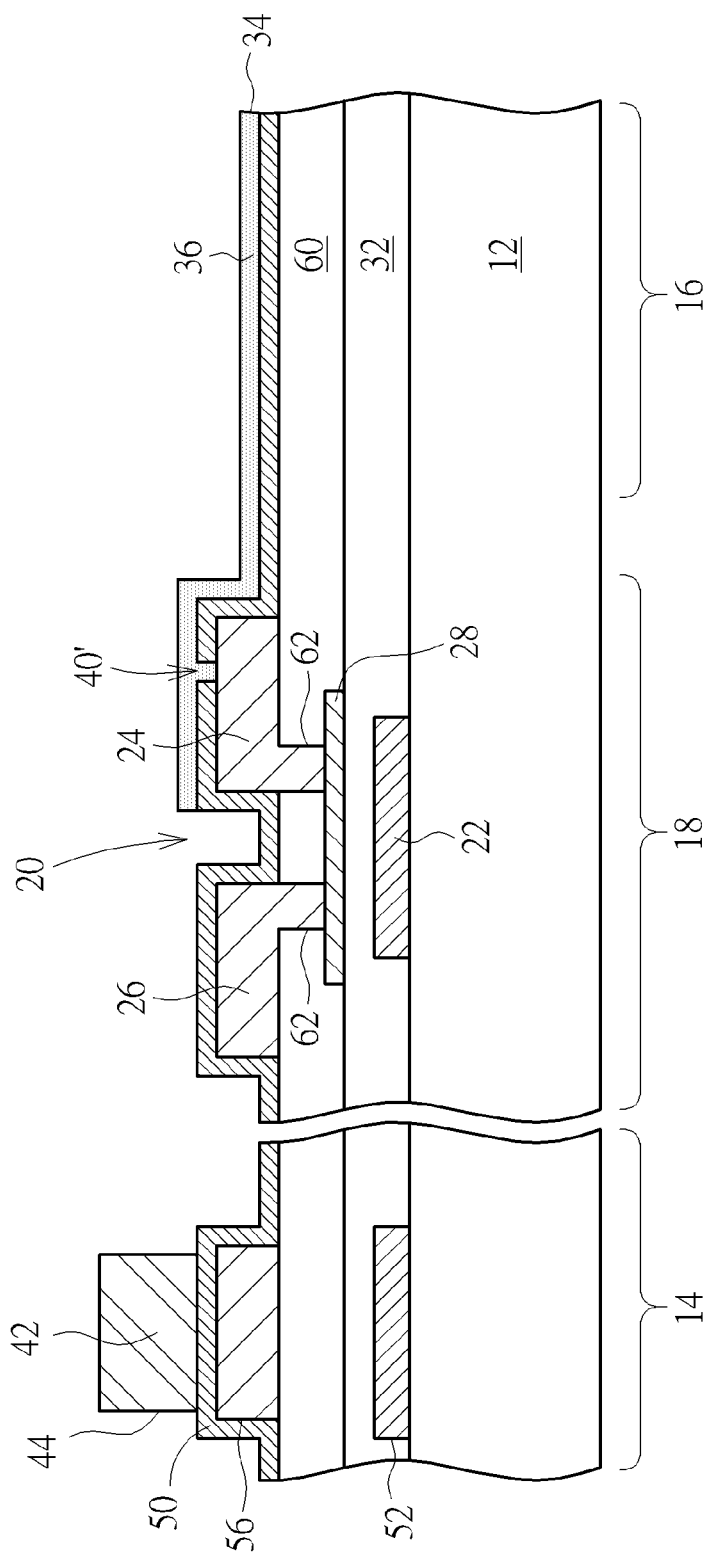
FIG. 7 to FIG. 8 are schematic diagrams illustrating the processes of the fabrication method of the organic light-emitting display panel according to the second embodiment of the present invention.
Figure 8:
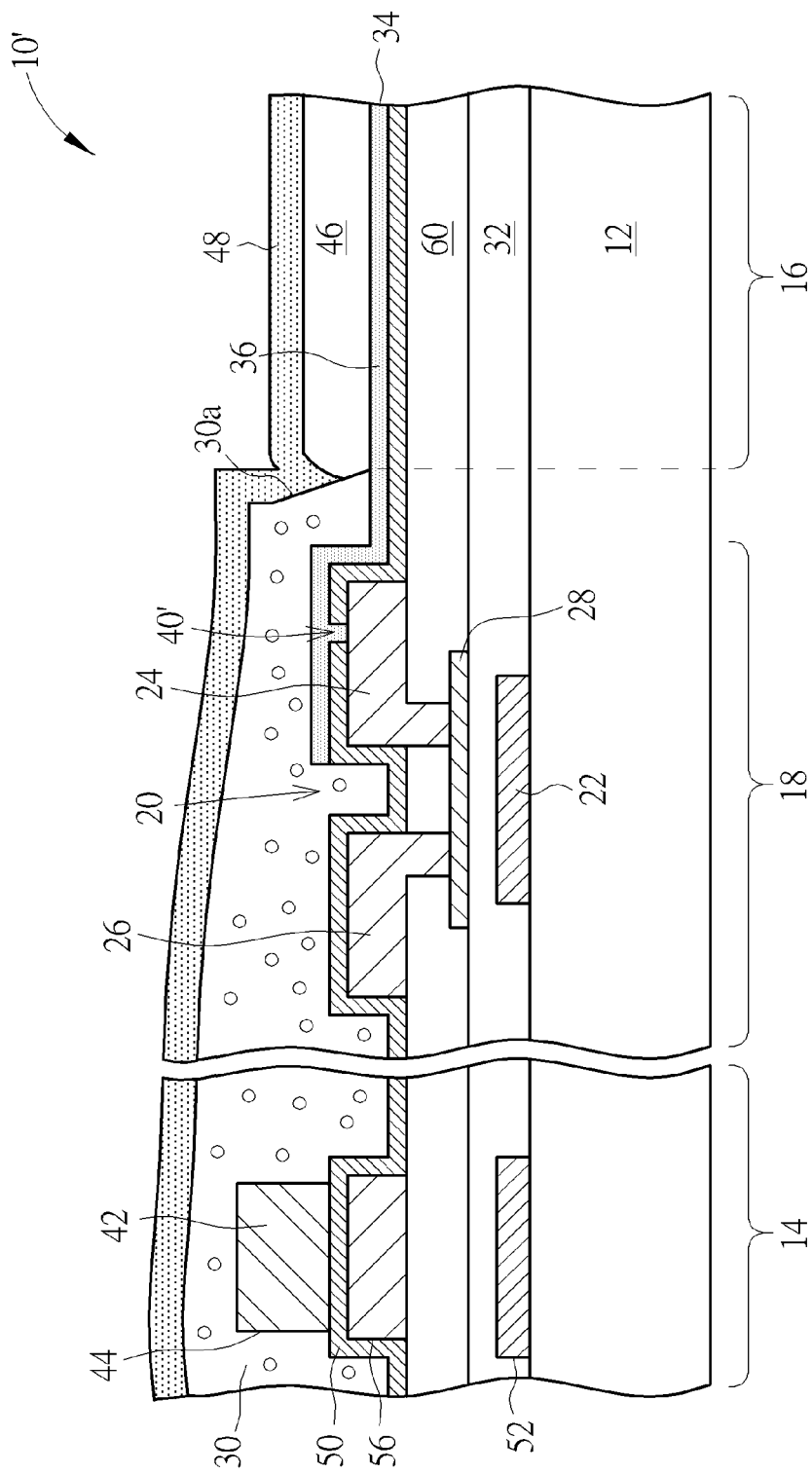

Referring to FIG. 7 and FIG. 8, FIG. 7 to FIG. 8 are schematic diagrams illustrating processes of the fabrication methods of the organic light-emitting display panel according to the second embodiment of the present invention, wherein FIG. 8 also shows a partial cross-section view of an organic light-emitting display panel according to the second embodiment of the present invention, and FIG. 7 shows the continues process of the second embodiment following FIG. 5. The second embodiment of the present invention is different from the first embodiment in that the spacer 42 is fabricated before forming the planarization 30. As shown in FIG. 7, after the fabrication of the thin film transistor 20 and the protection layer 50 is completed, the patterned first conductive layer 34 is formed on the substrate 12, wherein the patterned first conductive layer 34 includes a bottom electrode 36 at least disposed in the emission region 16 and is electrically connected to the drain 24 of the thin film transistor 20 through the contact hole 40' of the protection layer 50. Then, a spacer material layer 44 is formed on the substrate 12, which includes at least one spacer 42 disposed in the spacer region 14.

As shown in FIG. 8, a planarization layer 30 is then formed on the substrate 12 covering the spacer 42, a portion of the protection layer 50, the thin film transistor 20, and a portion of the bottom electrode 36. The opening 30a of the planarization layer 30 exposes and defines the emission region 16. Afterwards, an organic light-emitting material layer 46 and an upper electrode 48 are form in the emission region 16 in order to complete the fabrication of the organic light-emitting display panel 10' according to the second embodiment of the present invention. Wherein, the organic light-emitting material layer 46 is formed by the IJP process and it contacts a portion of the planarization layer 30. The planarization layer 30 includes ink-repellent material to make the organic light-emitting material layer 46 have preferable surface shape.

According to the second embodiment of the present invention, the spacer 42 is fabricated on the substrate 12 first and then the planarization layer 30 is fabricated on the spacer 42. Therefore, the spacer 42 fabricated on the surface of the protection layer 50 can have good fixation. Also, because the planarization layer 30 is disposed on the surface of the spacer 42, it can further protect the spacer 42 to prevent the spacer 42 from falling coming off from the substrate 12. In this embodiment, because the spacer material layer 44 does not directly contact the organic light-emitting material layer 46, the spacer material layer 44 may include any kind of suitable spacer material, such as organic photoresist material, but not limited thereto. The spacer material layer 44 may also be fluoride photoresist for example. In addition, the material of all the film layers in this embodiment may refer to the first embodiment, and no description will be repeated here.

In conclusion, the organic light-emitting display panel and the fabrication method thereof of the present invention avoid directly fabricating the spacer on the planarization layer with ink-repellent material, so that it can effectively prevent the problem of the spacer being ineffectively fixed and attached on the array substrate in the prior art. Therefore, there is no need to additionally fabricate the spacer on the cover plate, so as to further save the alignment process of the assembly process. As a result, the production cost can be effectively reduced. The concept of the present invention includes fabricating the position-retention element on top of the planarization layer simultaneously when the bottom electrode, or fabricating the spacer before the planarization layer. This concept of the present invention can be applied to the display panels having coplanar type TFT structure, etching-stop layer (ES) type TFT structure, and back-channel-etch (BCE) type TFT structure, but not limited thereto. From the above, the present invention has both advantages of high production yield of the spacer and the good profile of the organic emitting material formed by the IJP process achieved by using the planarization layer with the ink-repellent material, so to improve both the production yield and display effect of the organic light-emitting display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An organic light-emitting display panel, comprising:
   a substrate, having at least one spacer region and at least one emission region;
   a planarization layer, covering the spacer region but at least exposing the emission region, the planarization layer including ink-repellent material;
   a patterned first conductive layer, disposed on a surface of the substrate, comprising:
   a bottom electrode, at least disposed in the emission region; and
   a position-retention element, disposed on a surface of the planarization layer in the spacer region, wherein the position-retention element and the bottom electrode are electrically insulated from each other;
   at least one spacer, disposed on a surface of the position-retention element, wherein the position-retention element is disposed between the planarization layer and the spacer and structurally in contact with the planarization layer and the spacer directly; and
   an organic light-emitting material layer, disposed on a surface of the bottom electrode in the emission region;

wherein the planarization layer comprises an opening that exposes the emission region, the spacer is composed of a spacer material layer, and a portion of the spacer material layer is disposed adjoining to the emission region and covers a portion of a sidewall of the opening of the planarization layer.

2. The organic light-emitting display panel of claim 1, wherein the substrate further has a switch element region, and the organic light-emitting display panel further comprises at least one thin film transistor disposed in the switch element region, and a protection layer disposed on a surface of the thin film transistor conformally and the surface of the substrate and positioned under the planarization layer, the thin film transistor comprises a gate, a drain, a source and a semiconductor channel layer, the drain is electrically connected to the bottom electrode, the protection layer covers the emission region, the spacer region and a portion of the thin film transistor, the protection layer and the planarization layer have a contact hole exposing a portion of the drain, and the bottom electrode is electrically connected to the drain through the contact hole.

3. The organic light-emitting display panel of claim 2, wherein the semiconductor channel layer comprises metal oxide semiconductor material.

4. The organic light-emitting display panel of claim 2, wherein the gate is composed of a second conductive layer, the drain and the source are composed of a same third conductive layer, and a portion of the second conductive layer and a portion of the third conductive layer are disposed in the spacer region respectively.

5. The organic light-emitting display panel of claim 1, wherein the planarization layer comprises fluorine-containing photoresist material.

6. The organic light-emitting display panel of claim 1, wherein the spacer is composed of photoresist spacer material.

7. The organic light-emitting display panel of claim 6, wherein the photoresist spacer material is further formed in a surrounding area of the emission region and covers a portion of the bottom electrode, and the photoresist spacer material comprises fluorine-containing photoresist material or other ink-repellent material.

8. The organic light-emitting display panel of claim 1, wherein at least one portion of the organic light-emitting material layer is formed by an inkjet printing process.

9. The organic light-emitting display panel of claim 1, wherein the sidewall of the opening is covered by the bottom electrode.

10. A fabrication method of an organic light-emitting display panel, comprising:
  providing a substrate, wherein the substrate has at least one spacer region, at least one switch element region, and at least one emission region;
  forming a switch element in the switch element region;
  forming a planarization layer on the substrate, the planarization layer covering the spacer region and the switch element but at least exposing the emission region and at least one portion of the switch element, wherein the planarization layer comprises ink-repellent material;
  forming a patterned first conductive layer on the substrate, comprising:
    a bottom electrode, at least disposed in the emission region and electrically connected to the switch element; and
    a position-retention element, disposed on a surface of the planarization layer in the spacer region, wherein the position-retention element and the bottom electrode are electrically insulated from each other;
  forming at least one spacer on a surface of the position-retention element; and
  performing an inkjet printing process to form an organic light-emitting material layer disposed on a surface of the bottom electrode in the emission region,
  wherein the planarization layer comprises an opening that exposes the emission region, the spacer is composed of a spacer material layer, and a portion of the spacer material layer is disposed adjoining to the emission region and covers a portion of a sidewall of the opening of the planarization layer.

11. The fabrication method of the organic light-emitting display panel of claim 10, wherein the switch element is a thin film transistor including a gate, a drain, a source, and a semiconductor channel layer, and the fabrication method of the organic light-emitting display panel further comprises
  forming a protection layer on a surface of the thin film transistor conformally and a surface of the substrate before forming the planarization layer, the protection layer cover the emission region, the spacer region and a portion of the thin film transistor, the protection layer and the planarization layer have a contact hole exposing a portion of the drain, and the bottom electrode is electrically connected to the drain through the contact hole.

12. The fabrication method of the organic light-emitting display panel of claim 11, wherein the semiconductor channel layer comprises metal oxide semiconductor material.

13. The fabrication method of the organic light-emitting display panel of claim 10, wherein the planarization layer comprises fluorine-containing photoresist material.

14. The fabrication method of the organic light-emitting display panel of claim 10, wherein the spacer is composed of photoresist spacer material.

15. The fabrication method of the organic light-emitting display panel of claim 14, wherein the photoresist spacer material is further formed in a surrounding area of the emission region to cover a portion of the bottom electrode, and the photoresist spacer material comprises fluorine-containing photoresist material or other ink-repellent material.

16. An organic light-emitting display panel, comprising:
  a substrate, having at least one spacer region and at least one emission region;
  a bottom electrode, disposed on a surface of the substrate and at least in the emission region;
  at least one spacer, disposed in the spacer region;
  a planarization layer, disposed on the surface of the substrate and covering a top surface of the spacer and a sidewall of the spacer, the planarization layer at least exposing the emission region; and
  an organic light-emitting material layer, at least disposed on a surface of the bottom electrode in the emission region and covering a portion of the planarization layer;
  wherein the substrate further has a switch element region, the organic light-emitting display panel further comprises at least one thin film transistor disposed in the switch element region, and a protection layer disposed on a surface of the thin film transistor conformally and the surface of the substrate and at a lower side of the planarization layer, the thin film transistor comprises a gate, a drain, a source, and a semiconductor channel layer, the drain is electrically connected to the bottom electrode, the protection layer covers the emission region, the spacer region and a portion of the thin film transistor, the protection layer has a contact hole exposing a portion of the drain, and the bottom electrode is electrically connected to the drain through the contact hole;

wherein the planarization layer entirely covers the thin film transistor.

17. The organic light-emitting display panel of claim 16, wherein the semiconductor channel layer comprises metal oxide semiconductor material.

18. The organic light-emitting display panel of claim 16, wherein the gate is composed of a second conductive layer, the drain and the source are composed of the same third conductive layer, and a portion of the second conductive layer and a portion of the third conductive layer are disposed in the spacer region respectively.

19. The organic light-emitting display panel of claim 16, wherein the planarization layer comprises fluorine-containing photoresist material or other ink-repellent material.

20. The organic light-emitting display panel of claim 16, wherein the spacer is composed of a photoresist spacer material, and the photoresist spacer material comprises organic photoresist material or fluorine-containing photoresist material.

21. The organic light-emitting display panel of claim 16, wherein at least one portion of the organic light-emitting material layer is formed by an inkjet printing process.

* * * * *